United States Patent
Hou et al.

[11] Patent Number: 5,944,913
[45] Date of Patent: Aug. 31, 1999

[54] HIGH-EFFICIENCY SOLAR CELL AND METHOD FOR FABRICATION

[75] Inventors: Hong Q. Hou; Kitt C. Reinhardt, both of Albuquerque, N.Mex.

[73] Assignee: Sandia Corporation, Albuquerque, N.Mex.

[21] Appl. No.: 08/978,658

[22] Filed: Nov. 26, 1997

[51] Int. Cl.$^6$ .................................................. H01L 31/00
[52] U.S. Cl. .......................................... 136/255; 136/262
[58] Field of Search ...................................... 136/255, 262

[56] References Cited

U.S. PATENT DOCUMENTS 5,689,123  11/1997  Major et al. ............................ 257/190

OTHER PUBLICATIONS

K.A. Bertness et al., "29.5%–Efficient GaInP/GaAs Tandem Solar Cells," *Applied Physics Letters*, vol. 65, pp. 989–991, Aug. 22, 1994.

P.K. Chiang et al., "Experimental Results of GaInP$^2$/GaAs/Ge Triple Junction Cell Development for Space Power Systems," *Proceedings of the 25th IEEE Photovoltaic Specialists Conference*, pp. 183–186, May 1996.

M. Kondow et al., "GaInNAs: A Novel Material for Long–Wavelength–Range Laser Diodes with Excellent High–Temperature Performance," *Japanese Journal of Applied Physics*, vol. 35, pp. 1273–1275, 1996.

M. Meyer et al., "Flying High: The Commercial Satellite Industry Converts to Compound Semiconductor Solar Cells," *Compound Semiconductor*, pp. 22–24, Nov./Dec. 1996.

S. Sato et al., "Room–Temperature Operation of GaInNAs/GaInP Double–Heterostructure Laser Diodes Grown by Metalorganic Chemical Vapor Deposition," *Japanese Journal of Applied Physics*, vol. 36, pp. 2671–2675, 1997.

*Primary Examiner*—Mark Chapman
*Attorney, Agent, or Firm*—John P. Hohimer

[57] ABSTRACT

A high-efficiency 3- or 4-junction solar cell is disclosed with a theoretical AM0 energy conversion efficiency of about 40%. The solar cell includes p-n junctions formed from indium gallium arsenide nitride (InGaAsN), gallium arsenide (GaAs) and indium gallium aluminum phosphide (InGaAlP) separated by n-p tunnel junctions. An optional germanium (Ge) p-n junction can be formed in the substrate upon which the other p-n junctions are grown. The bandgap energies for each p-n junction are tailored to provide substantially equal short-circuit currents for each p-n junction, thereby eliminating current bottlenecks and improving the overall energy conversion efficiency of the solar cell. Additionally, the use of an InGaAsN p-n junction overcomes super-bandgap energy losses that are present in conventional multi-junction solar cells. A method is also disclosed for fabricating the high-efficiency 3- or 4-junction solar cell by metal-organic chemical vapor deposition (MOCVD).

61 Claims, 4 Drawing Sheets

HIGH-EFFICIENCY SOLAR CELL AND METHOD FOR FABRICATION

GOVERNMENT RIGHTS

This invention was made with Government support under the U.S. Air Force, and under Contract No. DE-AC04-94AL85000 awarded by the U.S. Department of Energy. The Government has certain rights in the invention.

FIELD OF THE INVENTION

The present invention relates to solar cells and methods for their fabrication, and more particularly to solar cells having a stacked semiconductor layer structure to provide a high efficiency for the conversion of incident light into electrical energy.

BACKGROUND OF THE INVENTION

High-efficiency solar cells are very important for use in space power systems for both commercial and military applications. An increased solar cell efficiency is advantageous in reducing satellite mass and launch cost, and also for increased satellite mission lifetime.

The size, mass, and cost of conventional satellite space power systems depends primarily on the optical-to-electrical energy conversion efficiency of the solar cells used. A maximum solar cell energy conversion efficiency is desired to reduce the area of a solar cell array, thereby enabling a greater payload mass and reduced launch vehicle costs. For example, an end-of-life electrical power requirement for a typical geosynchronous communications satellite might be 10 kW. Since the air-mass-zero (AM0) solar energy flux in space is 1.353 kW-m$^{-2}$, the 10 kW electrical power requirement would require a solar array panel area of about 50 m$^2$ when using 20% efficient solar cells. However, by increasing the solar cell efficiency to 40%, the same 10 kW electrical power requirement could be met with a solar array panel of one-half the area and weight.

Since the early 1960's, the paramount goal of the solar cell community has been to improve the energy conversion efficiency of solar cells. Progress towards the development of multi-junction solar cells was first reported in the 1980's. In 1994, a 2-junction InGaP/GaAs solar cell was disclosed with an energy conversion efficiency of 29.5% for incident light from the sun at 45° above the horizon (denoted as AM1.5). (See K. A. Bertness et al., "29.5% Efficient GaInP/GaAs Tandem Solar Cells," in *Applied Physics Letters*, vol. 65, pp. 989–991, 1994.) In 1996, a 3-junction InGaP/GaAs/Ge solar cell was disclosed with an AM0 (space solar spectrum) energy conversion efficiency of 25.7% (see P. K. Chiang et al., "Experimental Results of GaInP$_2$/GaAs/Ge Triple Junction Cell Development for Space Power Systems," in *Proceedings of the 25th IEEE Photovoltaic Specialists Conference*, pp. 183–186, 1996).

The above 3-junction InGaP/GaAs/Ge solar cell comprises three p-n junctions (i.e. one p-n junction in each semiconductor layer) connected by two tunnel junctions. The resulting structure is a monolithic, series connected, lattice-matched solar cell having three light-absorbing layers with bandgap energies of 1.85 electron volts (eV) for an InGaP layer, 1.42 eV for a GaAs layer, and 0.67 eV for a Ge layer or substrate. The energy conversion efficiency of this 3-junction solar cell is limited by a relatively large 0.75 eV difference in the bandgap energy of the GaAs and Ge materials which results in a significant super-bandgap energy loss to the Ge in the form of heat. Additionally, the energy conversion efficiency of the 3-junction solar cell is limited by a relatively low bandgap energy of the InGaP layer which limits the number of solar photons reaching the underlying GaAs layer and the electrical current produced therein. Since each layer within the solar cell is connected in series, the electrical current limitation of the GaAs layer limits the overall solar cell electrical current that can be produced in response to solar illumination.

Four-junction solar cells have been attempted heretofore by incorporating an InGaAs or a ZnGeAs$_2$ junction within an InGaP/GaAs/Ge solar cell. In the case of the InGaAs 4-junction solar cell, the overall performance was apparently compromised by a high dislocation density in the mismatched layers of the solar cell structure. The ZnGeAs$_2$ 4-junction solar cell was not successful due to an inability to dope the ZnGeAs$_2$ n-type to form a p-n junction. Yet another approach to form a high-efficiency 4-junction solar cell has been to mechanically stack a 2-junction monolithic InGaP/GaAs solar cell above another 2-junction InGaAsP/InGaAs solar cell. The resultant mechanically stacked 4-junction solar cell has a theoretical AM0 energy conversion efficiency of about 32–35%, but the approach is not practical due to yield, scale-up, and manufacturing issues.

An advantage of the present invention is that a high-efficiency solar cell is disclosed that provides a substantial reduction in the super-bandgap energy loss compared to the prior art.

Another advantage is that substantially equal electrical currents can be generated within each homojunction of the high-efficiency solar cell of the present invention in response to solar illumination, thereby increasing device efficiency by eliminating restrictions to electrical current flow.

A further advantage of the high-efficiency solar cell of the present invention is that a high energy conversion efficiency of about 40% can be achieved with embodiments of the invention as either a 3-junction solar cell or a 4-junction solar cell.

These and other advantages of the method of the present invention will become evident to those skilled in the art.

SUMMARY OF THE INVENTION

The present invention relates to a high-efficiency solar cell and a method for fabrication thereof. The high-efficiency solar cell comprises a plurality of stacked semiconductor p-n junctions (also termed herein as homojunctions when formed from a single semiconductor layer or termed heterojunctions when formed from a pair of layers of different semiconductor alloy composition) with each p-n junction being formed in an epitaxially-grown semiconductor layer(s) of different semiconductor alloy compositions. The epitaxially-grown semiconductor layers containing the p-n junctions are separated by epitaxially-grown semiconductor tunnel junctions which are oriented with a polarity opposite that of the p-n junctions (i.e. a plurality of p-n junctions are separated by n-p tunnel junctions).

Furthermore, one of the semiconductor p-n junctions in the high-efficiency solar cell comprises a layer formed of a semiconductor alloy of indium gallium arsenide nitride (InGaAsN); and another of the p-n junctions located above the InGaAsN homojunction preferably comprises indium gallium aluminum phosphide (InGaAlP). The high-efficiency solar cell can be epitaxially grown on a semiconductor substrate (e.g. a germanium or gallium arsenide substrate) that can optionally contain a diffused p-n junction (e.g. a homojunction) formed below an upper surface of the substrate (e.g. by a thermal diffusion process whereby a dopant species on one polarity is thermally diffused into a substrate of the opposite polarity at an elevated temperature) prior to or during epitaxial growth of the plurality of semiconductor layers. Alternately, a p-n junction can be formed in the substrate by epitaxially growing a semiconductor layer of one polarity upon a substrate of the opposite polarity (e.g. an n-type Ge layer epitaxially grown upon a p-type Ge substrate thereby forming a Ge p-n homojunction).

For optimum efficiency, the semiconductor alloy composition of the InGaAsN semiconductor layer forming the InGaAsN p-n junction can be selected to provide a bandgap energy in a range from about 1.0 eV to 1.2 eV, and preferably about 1.05 eV. In embodiments of the present invention employing an indium gallium aluminum phosphide (InGaAlP) semiconductor layer for forming an InGaAlP p-n junction, the composition of this layer is preferably selected to provide a bandgap energy of about 2.0 eV. Additionally, each semiconductor layer is preferably grown with a lattice constant $a_0$, substantially equal to the lattice constant of the substrate so that the solar cell is lattice-matched with minimal strain.

A preferred embodiment of the present invention employs a germanium (Ge) substrate having a diffused homojunction therein. Upon the Ge substrate are epitaxially grown a first p-n homojunction comprising indium gallium arsenide nitride (InGaAsN) with a semiconductor alloy composition selected to provide a bandgap energy in the range of 1.0–1.2 eV, and most preferably about 1.05 eV; a second p-n homojunction comprising gallium arsenide (GaAs); and a third p-n homojunction comprising indium gallium aluminum phosphide (InGaAlP) with a semiconductor alloy composition selected to provide a bandgap energy of about 2.0 eV.

Semiconductor tunnel junctions are provided between each pair of the p-n homojunctions during epitaxial growth, and between the diffused homojunction formed in the Ge substrate and the first InGaAsN homojunction. A first tunnel junction grown between the Ge substrate and the first InGaAsN homojunction comprises either a GaAs tunnel junction, or an InGaAsN tunnel junction, or an indium gallium aluminum arsenide nitride (In(GaAl)AsN) tunnel junction. A second tunnel junction grown between the first InGaAsN homojunction and the second GaAs homojunction preferably comprises a GaAs tunnel junction; and a third tunnel junction grown between the second GaAs homojunction and the third InGaAlP homojunction preferably comprises an aluminum gallium arsenide (AlGaAs)/indium gallium phosphide (InGaP) tunnel junction. In this 4-junction embodiment of the present invention, each semiconductor layer can have a layer thickness generally in the range of 1–5 microns ($\mu$m), and preferably about 3 $\mu$m; and each tunnel junction is generally about 20–30 nanometers (nm) thick.

This 4-junction embodiment of the present invention can further include a passivation layer of indium aluminum phosphide (InAlP) that is epitaxially grown to blanket the homojunctions; and a GaAs cap layer can be epitaxially grown over the passivation layer. Both the passivation and cap layers are doped to conduct electricity generated by the solar cell in response to light incident on each p-n homojunction. Fabrication of this preferred embodiment of the high-efficiency solar cell of the present invention can be completed by patterning the GaAs cap layer by etching to provide one or more windows or openings therethrough. Such patterning of the cap layer eliminates absorption of a portion of the incident light (i.e. solar illumination) that would otherwise occur if the cap layer were not locally removed. Additionally, a patterned upper electrode is deposited above the cap layer; and a full-surface lower electrode can be provided below the substrate. A multi-layer anti-reflection (AR) coating (e.g. comprising alternating layers of $SiO_2$ and $TiO_2$) is provided over the exposed passivation layer to reduce reflection losses of the incident light. In operation, this preferred embodiment of the high-efficiency solar cell converts sunlight into electrical energy with a theoretical energy conversion efficiency of about 40%.

In other embodiments of the present invention, the diffused homojunction in the Ge substrate can be omitted. Additionally, embodiments of the present invention can be formed as a 3-junction solar cell on a GaAs substrate which does not include a diffused homojunction or a first tunnel junction therein. In embodiments of the invention omitting the diffused homojunction, the reduction in the theoretical energy conversion efficiency is expected to be less than 3%.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
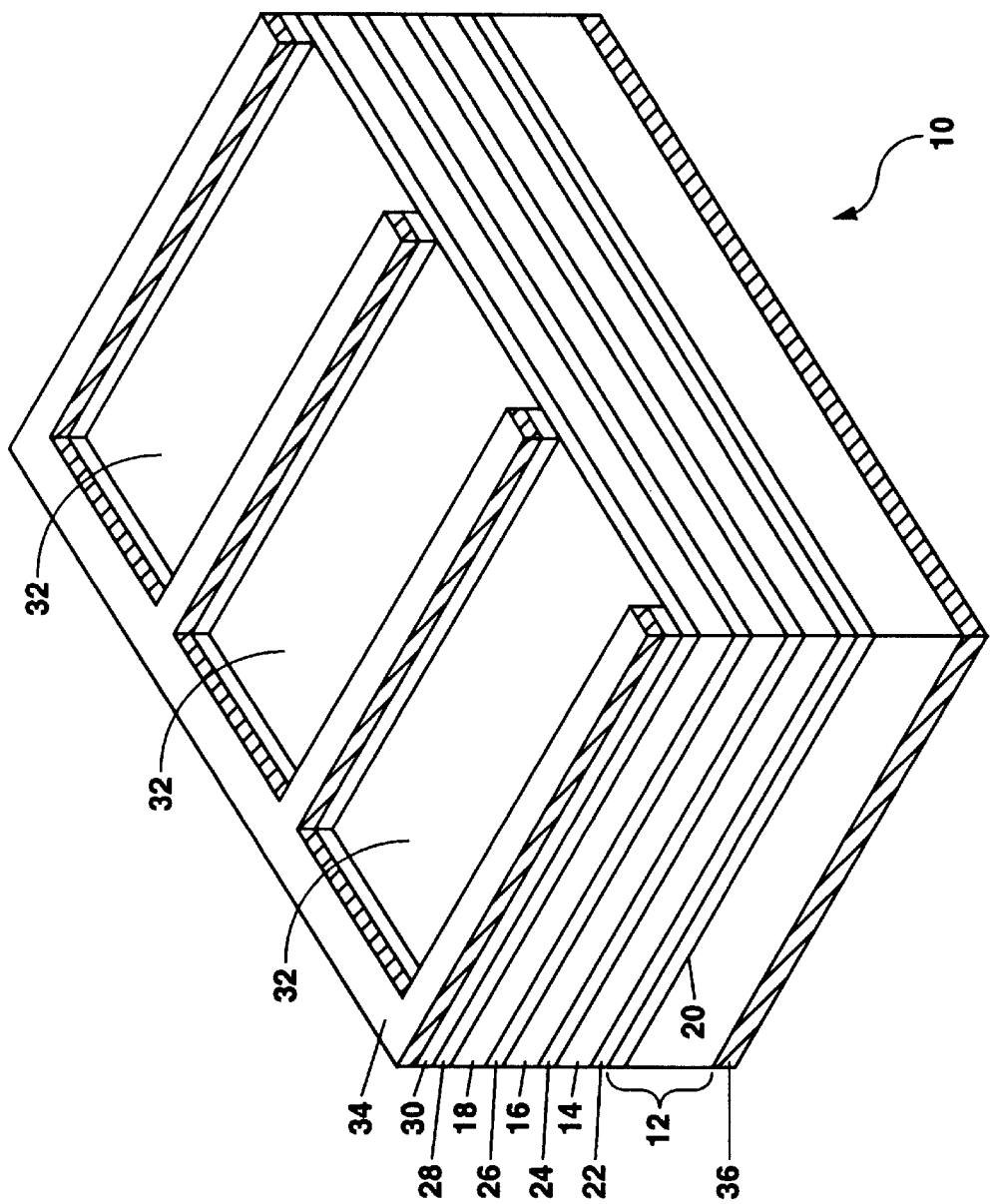
FIG. 1 shows a schematic diagram of a high-efficiency solar cell formed according to the present invention.

Referring to FIG. 1, there is shown schematically a preferred embodiment of a high-efficiency solar cell according to the present invention. In FIG. 1, the preferred embodiment of the high-efficiency solar cell 10 comprises a substrate 12 upon which an epitaxial structure is grown that includes a plurality of p-n homojunctions of different semiconductor alloy compositions. In FIG. 1, the homojunctions include in order of epitaxial growth: a first homojunction 14 comprising indium gallium arsenide nitride (InGaAsN), a second homojunction 16 comprising gallium arsenide (GaAs), and a third homojunction 18 comprising indium gallium aluminum phosphide (InGaAlP).

In FIG. 1, each homojunction is formed during epitaxial growth of a layer having the semiconductor alloy composition of the homojunction, thereby resulting in a layered or stacked homojunction structure for the solar cell 10. The substrate 12 generally comprises germanium (Ge) which provides a good mechanical strength for the solar cell 10. In other embodiments of the present invention, GaAs can be used as a substrate material.

An additional p-n homojunction 20 is generally formed within or directly above the substrate 12 when the substrate comprises Ge. For example, when a p-type doped germanium substrate 12 is used, the diffused p-n homojunction 20 can be formed by thermally diffusing arsenic (As) as an n-type dopant into an upper surface of the substrate 12 at an elevated temperature. The diffused homojunction 20 can be formed either prior to epitaxial growth of the plurality of semiconductor layers, or during epitaxial growth. Additionally an epitaxially-formed substrate homojunction can be substituted for the diffused homojunction 20, for example, by growing a thin n-type Ge layer on a p-type Ge substrate 12.

In FIG. 1, each pair of the homojunctions is separated by an epitaxially-grown semiconductor tunnel junction (defined herein as a semiconductor junction that is sufficiently thin to provide for tunneling of carriers therethrough under reverse-bias conditions). The tunnel junctions are oriented with a polarity opposite that of the homojunctions (i.e. n-p tunnel junctions separating p-n homojunctions).

In FIG. 1, the semiconductor tunnel junctions include a first tunnel junction 22 located between the substrate 12 and the first homojunction 14; a second tunnel junction 24 located between the first homojunction 14 and the second homojunction 16; and a third tunnel junction 26 located between the second homojunction 16 and the third homojunction 18.

In FIG. 1, the epitaxial structure of the preferred embodiment of the high-efficiency solar cell 10 further includes a passivation layer 28 epitaxially grown above the third homojunction 18, and a cap layer 30 epitaxially grown above the passivation layer 28. The passivation layer 28 is substantially transparent to solar illumination and can comprise, for example, indium aluminum phosphide (InAlP). The cap layer 30 is generally GaAs which is patterned by etching to provide one or more windows or openings 32 therethrough. Patterning of the GaAs cap layer 30 prevents absorption of the solar illumination which would otherwise occur in the GaAs layer 30. An upper electrode 34 can be deposited above the cap layer 30 and patterned to conform to an etched shape of the patterned cap layer 30. A full-surface lower electrode 36 can be deposited on a lower surface of the substrate 12.

A 4-junction high-efficiency solar cell 10 can be fabricated using the method set forth herebelow. A preferred method for epitaxially growing the layered structure of the solar cell 10 is based upon metal-organic chemical vapor deposition (MOCVD), particularly low-pressure MOCVD with an ambient pressure of about 60 torr. However, the present invention is not limited to MOCVD growth, and other growth methods such as molecular beam epitaxy (MBE) or liquid phase epitaxy (LPE) can also be used according to the present invention.

In fabricating the solar cell 10 by MOCVD, a primary concern is the epitaxial growth of the p-n homojunctions, n-p tunnel junctions, and back surface field layers (not shown in FIG. 1) with a high material quality (i.e. without substantial defects or residual strain). Since each of the homojunctions 14, 16 and 18 are formed in semiconductor layers having different semiconductor alloy compositions, the epitaxial growth method to be used must consider compatibility limitations, especially in terms of temperature, during the epitaxial growth. Additionally, each of the layers containing the homojunctions 14, 16 and 18 can be up to about 5 microns thick. As a result, these semiconductor layers must be grown with semiconductor alloy compositions that provide a substantial lattice match with the Ge (or GaAs) substrate 12. Lattice matching as the term is used herein means that a lattice constant, $a_0$, of each of the semiconductor layers containing homojunctions 14, 16 and 18 is substantially equal to the lattice constant of the substrate 12.

The growth temperature for the InGaAsN semiconductor layer containing the first homojunction 14 is especially important due to possible diffusion of Ge from the substrate into the InGaAsN layer and into the underlying first tunnel junction 22 which can comprise either GaAs, or InGaAsN or indium gallium aluminum arsenide nitride (In(GaAl)AsN). Additionally, arsenic (As) can diffuse downward from the InGaAsN layer and tunnel junction 22 into the substrate 12. Such diffusion processes are temperature dependent, limiting the epitaxial growth of the InGaAsN layer to temperatures below about 700° C.

The underlying first tunnel junction 22 can be grown at a temperature in the range of 640–750° C. when formed of GaAs. A higher growth temperature is not problematic here for interdiffusion of Ge and As since the first tunnel junction 22 is only about 20–30 nanometers thick, and the growth is accomplished in about one minute since typical growth rates for each of the semiconductor layers in FIG. 1 ranges from about 2–4 microns per hour. Trimethylgallium (TMGa) and arsine (AsH$_3$) can be used as source gases for growing a GaAs first tunnel junction 22, with hydrogen (H$_2$) being used as a carrier gas.

During epitaxial growth of the first tunnel junction 22, carbon tetrachloride (CCl$_4$) or carbon tetrabromide (CBr$_4$) can be used as a p-type dopant to dope a substrate side of the first tunnel junction 22 to about $3 \times 10^{19}$ cm$^{-3}$; and disilane (Si$_2$H$_6$) can be used as an n-type dopant to dope the other side of the first tunnel junction 22 to about $6 \times 10^{18}$ cm$^{-3}$. GaAs is preferred for forming the first tunnel junction 22, since GaAs can be doped with high n- and p-type free carrier concentrations to about $10^{19}$ cm$^{-3}$. Other semiconductor alloy compositions such as InGaAsN or In(GaAl)AsN can also be used to form the first tunnel junction 22. If InGaAsN is used to form the first tunnel junction 22, the indium (In) and nitrogen (N) compositions in the InGaAsN semiconductor alloy should be less than the compositions in the overlying InGaAsN first homojunction 14 so that the tunnel junction 22 has a slightly higher bandgap energy than that of the first homojunction 14. Additionally, InGaAsN and In(GaAl)AsN are generally grown at temperatures in the range of 500–680° C. as will be described in greater detail hereinafter.

A first back-surface field (BSF) layer (not shown in FIG. 1) comprising GaAs with a thickness of about 30 nanometers can be epitaxially grown above the first tunnel junction 22 at a growth temperature in the range of 600–750° C. This first BSF layer can be n-type doped (using Si$_2$H$_6$) to about $2 \times 10^{18}$ cm$^{-3}$. The first BSF layer, with a higher bandgap energy than the overlying first homojunction 14, functions to prevent carriers (i.e. electrons and holes) which are generated in the first homojunction 14 in response to absorption of a portion of the incident light from diffusing downward into the first tunnel junction 22.

The growth of InGaAsN for the first homojunction 14 (and the underlying tunnel junction 22 when formed from this same material) is preferably performed at a temperature in the range of 500–680° C. With epitaxial growth by low-pressure MOCVD, the InGaAsN first homojunction 14 can be grown by using hydrogen ($H_2$) as a carrier gas; and trimethylindium (TMIn), trimethylgallium (TMGa), arsine ($AsH_4$) and dimethylhydrazine (DMHy) as source gases. The InGaAsN layer in which the first homojunction 14 is formed can be up to several microns thick (e.g. 1–5 $\mu$m), with the homojunction 14 being formed by selective doping of the InGaAsN layer during epitaxial growth. Carbon from carbon tetrachloride ($CCl_4$) or carbon tetrabromide ($CBr_4$) is useful for doping a portion of the InGaAsN layer 14 p-type at a free-carrier concentration up to $1 \times 10^{19}$ cm$^{-3}$ for forming one side of the p-n homojunction 14. Among potential n-type dopants are silicon from either $Si_2H_6$, or silicon tetrachloride ($SiCl_4$) or silicon tetrabromide ($SiBr_4$); and tellurium from diethyltellurium (DETe). $SiCl_4$ or $SiBr_4$ are preferred as n-type dopant sources since they allow free-carrier concentrations to be achieved over the range from $5 \times 10^{16}$ cm$^{-3}$ to $5 \times 10^{18}$ cm$^{-3}$. Disilane ($Si_2H_6$) is less preferable as an n-type dopant source gas due to a possible gas phase reaction with the DMHy. Studies with DETe showed this source gas to be wholly unsuitable as an n-type dopant source gas for the InGaAsN layer due to a very strong reaction between DETe and DMHy.

For lattice matching to the Ge substrate 12 (or alternately to a GaAs substrate 12), the composition of the InGaAsN layer containing the first homojunction 14 can be selected to be $In_xGa_{1-x}As_{1-y}N_y$ where the compositional values for x and y are related by the compositional value of x being substantially equal to three times the compositional value for y (i.e. x~3y). Such lattice matching can be ascertained from an x-ray diffraction curve of the InGaAsN layer.

The $In_xGa_{1-x}As_{1-y}N_y$ layer can be grown with an indium (In) composition, x, up to about 10%, and with a nitrogen (N) composition, y, up to about 3%. In order to form the high-efficiency solar cell 10, the InGaAsN layer containing the first homojunction 14 should preferably have a bandgap energy in the range of 1.0–1.2 eV, and most preferably about 1.05 eV. At the present moment, the $In_xGa_{1-x}As_{1-y}N_y$ material system is not well understood so that an exact correlation of bandgap energy with semiconductor alloy composition is problematic. However, the bandgap energy of the InGaAsN layer containing the first homojunction 14 can be readily ascertained from a measurement of a room-temperature absorption spectrum (see FIG. 2), and the measured value of the bandgap energy can be correlated with epitaxial growth parameters of the MOCVD apparatus used to grow the InGaAsN layer.

To improve the material quality of the InGaAsN layer containing the first homojunction 14, an annealing step can be performed at an elevated temperature of about 700–800° C. for typically 5–10 minutes. This annealing step is preferably performed within the MOCVD growth apparatus (i.e. in-situ) using an ambient (about 60 torr total pressure) of nitrogen and arsine. An improvement in the quality of the InGaAsN layer and first homojunction 14 produced by the annealing step is readily observable from a photoluminescence (PL) measurement, with the annealed InGaAsN layer having an increase in PL intensity of up to 3 orders of magnitude compared to an unannealed InGaAsN layer.

Figure 2:
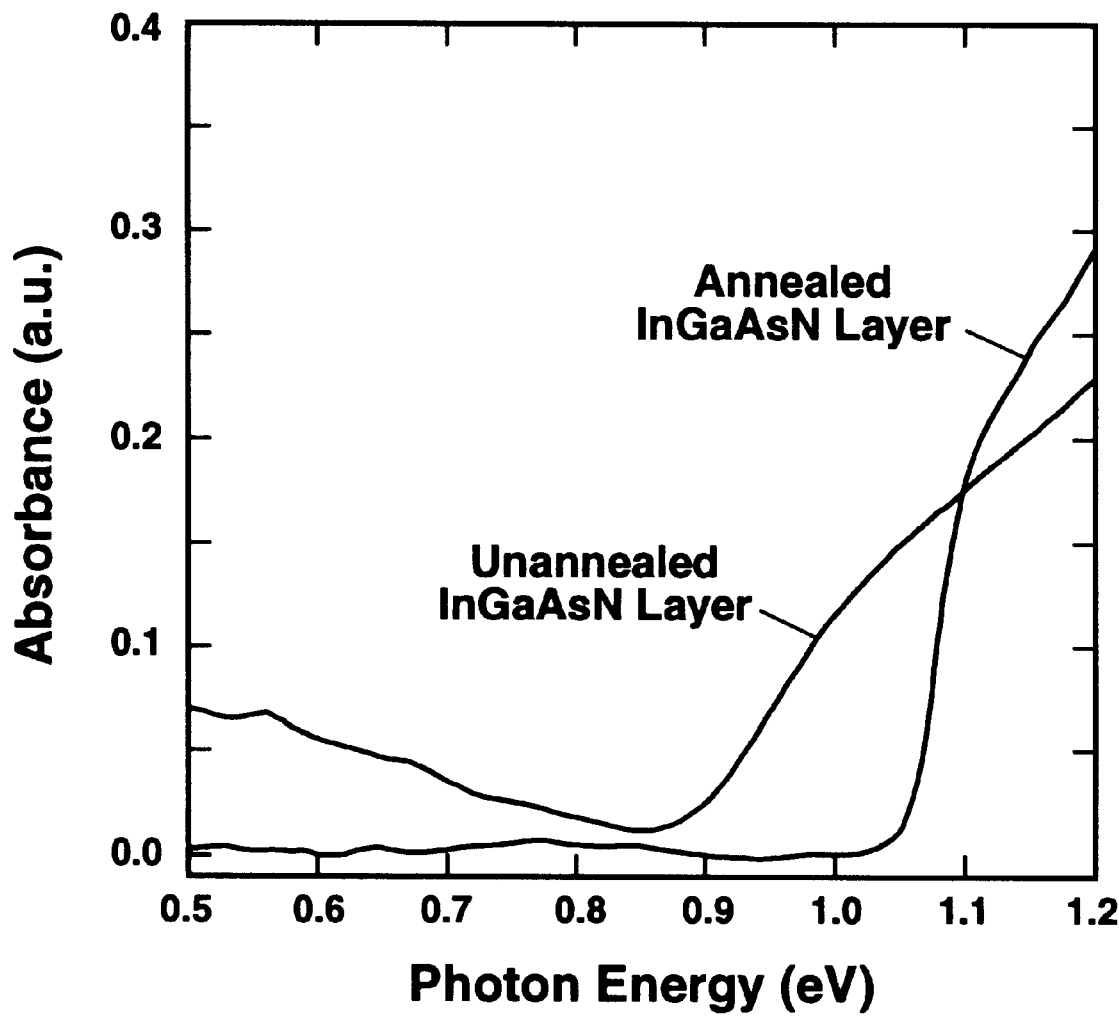
FIG. 2 shows room-temperature absorption spectra for indium gallium arsenide nitride (InGaAsN) layers grown according the present invention with and without an in-situ annealing step.

The improvement in quality of the InGaAsN layer containing the first homojunction 14 can also be observed from a room-temperature absorption spectrum as shown in FIG. 2. In FIG. 2, an unannealed InGaAsN layer shows a significant absorption below the bandgap energy of 1.05 eV due to impurities. After the annealing step, the InGaAsN layer shows a well-defined absorption band edge at 1.05 eV, with reduced absorption from impurities.

To evaluate the electrical characteristics of the first homojunction 14 formed in the InGaAsN layer, this layer was grown on an N$^+$ GaAs substrate 12 without any tunnel junctions or other semiconductor layers. The InGaAsN layer grown for this electrical evaluation test was 1.1 $\mu$m thick, with the first 0.8 $\mu$m thickness of the layer being doped n-type to about $10^{17}$ cm$^{-3}$, and with the remaining 0.3 $\mu$m thickness of the layer being doped p-type to $4 \times 10^{18}$ cm$^{-3}$, thereby forming the first p-n homojunction 14 therein. The energy bandgap of the InGaAsN layer was 1.05 eV.

Figure 3:
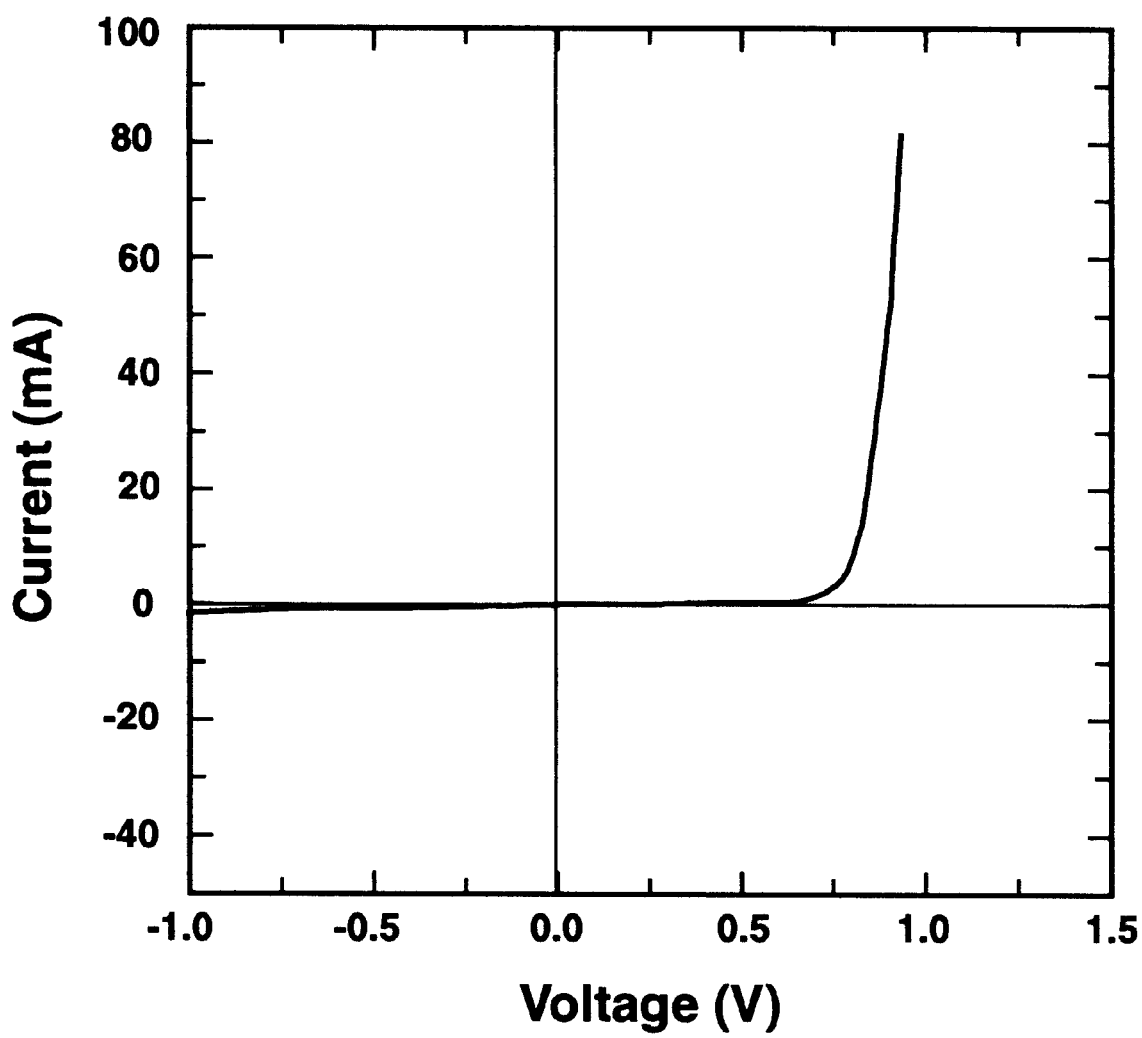
FIG. 3 shows a current-versus-voltage (I-V) curve measured for a 1-mm-diameter p-n homojunction formed in an indium gallium arsenide nitride (InGaAsN) layer according to the present invention.

Circular diodes were formed from the InGaAsN layer by blanketing the layer with a patterned etch mask and etching a plurality of circular mesas with diameters ranging from 50 microns to 1 millimeter using an $H_3PO_4:H_2O_2:H_2O$ wet etchant. Electrodes were formed above the InGaAsN layer and below the GaAs substrate, with an upper electrode above the InGaAsN layer being formed of an Au/Be patterned metallization, and with a lower electrode below the GaAs substrate being formed of a Au/Ge/Ni full-surface metallization. FIG. 3 shows a current-versus-voltage (I-V) curve measured for a 1-mm-diameter p-n homojunction 14 formed in this InGaAsN layer.

Figure 4:
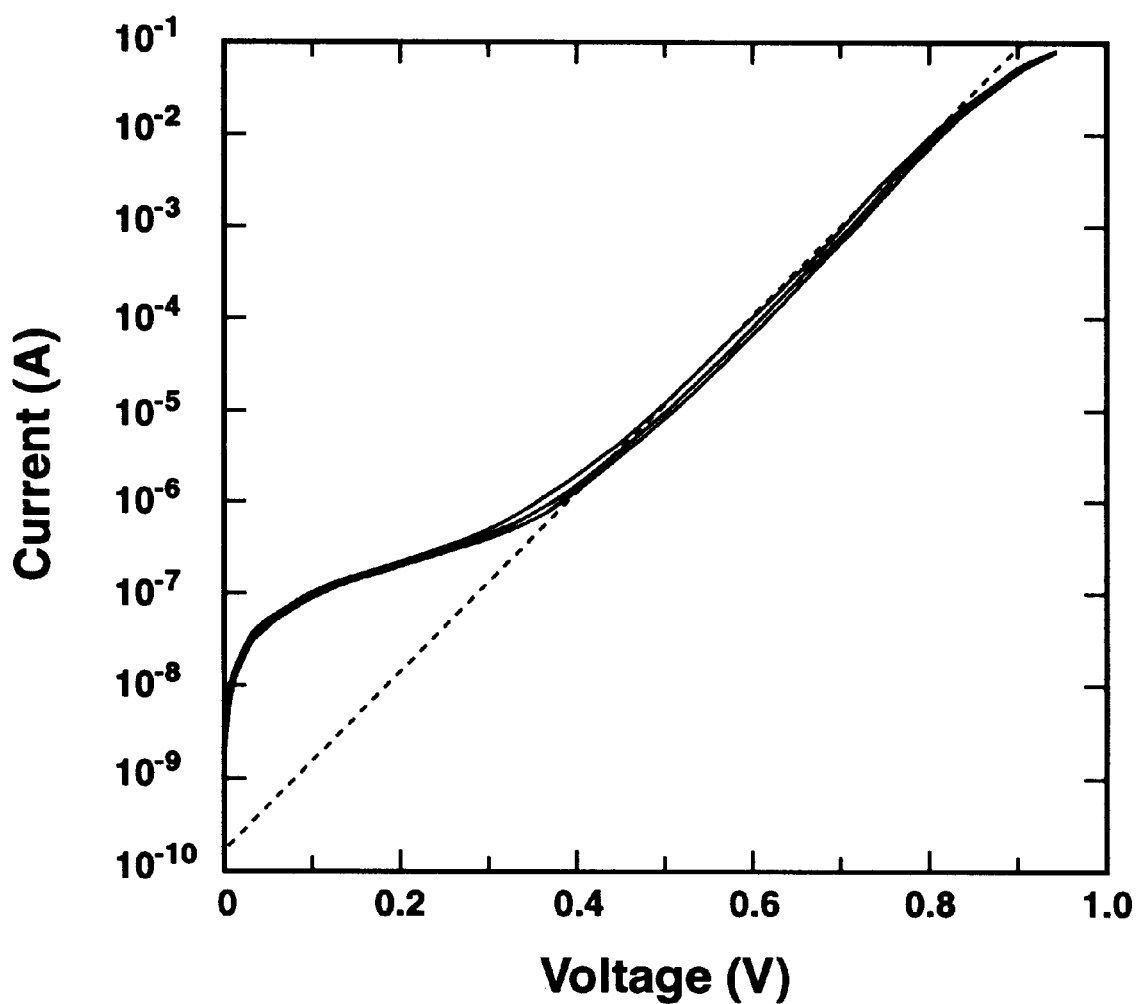
FIG. 4 shows forward-bias I-V curves for 1-mm-diameter InGaAsN homojunctions on a logarithmic scale to show an ideality factor of 1.8 for the homojunctions as indicated by the slope of a fit to the measured curves (dashed line) and a zero-bias leakage current (indicated by the y-axis intercept of the dashed-line fit).

FIG. 4 shows forward-bias I-V curves for a plurality of 1-mm-diameter diodes (i.e. p-n homojunctions 14) on a logarithmic scale for measuring a zero-bias leakage current and an ideality factor for the diodes. In FIG. 4, the slope of the dashed line fitted to the curves shows that the fabricated diodes have an ideality factor of 1.8. This value of the ideality factor indicates that carrier transport in the diodes includes terms due to both carrier diffusion and carrier recombination. The carrier recombination is undesirable, but can be reduced by passivating the InGaAsN layer 14 (e.g. with a passivation layer). An extrapolation of the dashed line fit in FIG. 4 to zero voltage shows that the best of the fabricated diodes have a zero-bias leakage current as low as $5 \times 10^{-10}$ A. This indicates a very high electrical quality for the InGaAsN first homojunction 14.

Additionally, photovoltaic characteristics of a 1 cm×1 cm diode formed from the InGaAsN layer grown on the N$^+$ GaAs substrate were made using an ×25 solar simulator. These measurements demonstrate photovoltaic behavior of the InGaAsN layer and first homojunction 14 therein, with the first homojunction 14 providing an open-circuit voltage of about 0.4V in response to the incident light.

For use in the 4-junction solar cell 10 of FIG. 1 (or alternately in a 3-junction solar cell formed without the diffused Ge homojunction 20 and first tunnel junction 22), the InGaAsN layer containing the first homojunction 14 can be, for example, 3.15 $\mu$m thick, with the first 3 $\mu$m thickness of the InGaAsN layer being doped n-type to about $10^{17}$ cm$^{-3}$ with $SiCl_4$ or $SiBr_4$, and with the remaining 0.15 $\mu$m thickness of the InGaAsN layer being doped p-type to about $3 \times 10^{18}$ cm$^{-3}$ with $CCl_4$. Above the InGaAsN layer containing the first homojunction 14 is epitaxially grown a GaAs layer forming the second tunnel junction 24. This GaAs layer is about 40 nm thick, with a lower one-half of the layer doped p-type to about $3 \times 10^{19}$ cm$^{-3}$ with carbon (from $CCl_4$ or $CBr_4$), and with the remainder of the layer being doped n-type to about $6 \times 10^{18}$ cm$^{-3}$ with silicon (from $Si_2H_6$). The GaAs layer containing the second tunnel junction 24 can be grown at a temperature in the range of 640–750° C.

Above the second tunnel junction 24 is epitaxially grown by MOCVD a second back-surface field (BSF) layer (not shown in FIG. 1) comprising a 30-nm-thick layer of $Al_{0.2}Ga_{0.8}As$. The second BSF layer is grown using trimethylaluminum (TMAl), TMGa and $AsH_3$ as source gases at a growth temperature of about 750° C. The second BSF layer can be n-type doped to about $3\times10^{18}$ cm$^{-3}$ with silicon (from $Si_2H_6$). The second BSF layer has a bandgap energy of about 1.6 eV and functions similarly to the first BSF layer described heretofore.

Above the second BSF layer is epitaxially grown by MOCVD a GaAs second homojunction 16. The second homojunction 16 can be formed, for example, in a 3.15-$\mu$m-thick GaAs layer, with the first 3 $\mu$m of the GaAs layer being doped n-type to about $10^{17}$ cm$^{-3}$ with silicon (from $Si_2H_6$), and with the remainder of the GaAs layer being doped p-type to about $3\times10^{18}$ cm$^{-3}$ with carbon (from $CCl_4$ or $CBr_4$). This GaAs layer can be grown at a temperature in the range of about 640–750° C. The energy bandgap for this GaAs layer is 1.42 eV.

Above the second homojunction 16 is epitaxially grown by MOCVD a third tunnel junction 26. The third tunnel junction 26 can be formed as a heterojunction by first growing a 20-nm-thick layer of AlGaAs (e.g. $Al_{0.35}Ga_{0.65}As$) doped p-type to about $3\times10^{19}$ cm$^{-3}$ with carbon (from $CCl_4$ or $CBr_4$), and then growing a 20-nm-thick layer of InGaP (e.g. $In_{0.49}Ga_{0.51}P$) which is doped n-type to about $6\times10^{18}$ cm$^{-3}$ with silicon (from $Si_2H_6$). The source gases used for growing AlGaAs layers are TMAl, TMGa and $AsH_3$; whereas phosphine ($PH_3$), TMIn and TMGa are the source gases used for growing the InGaP layer. Each of these layers can be grown at a temperature in the range of 650–750° C. The bandgap energy of the third tunnel junction 26 is about 1.85 eV.

Above the third tunnel junction 26 is epitaxially grown by MOCVD a third BSF layer (not shown in FIG. 1). The third BSF layer can comprise a 30-nm-thick layer of indium gallium aluminum phosphide (InGaAlP) with a composition that can be, for example, $In_{0.5}Ga_{0.35}Al_{0.15}P$ for providing a bandgap energy of about 2.2 eV. The InGaAlP layer can be doped n-type to $4\times10^{18}$ cm$^{-3}$ with silicon from $Si_2H_6$. The third BSF layer with a bandgap energy higher than the underlying third tunnel junction 26 functions to prevent carriers which are generated in an overlying homojunction (i.e. a third homojunction 18 in FIG. 1) from diffusing downward into the third tunnel junction 26. The source gases for growing the InGaAlP third BSF layer are the same as those used for growing the layers in the third tunnel junction 26.

Above the third BSF layer is epitaxially grown by MOCVD a third homojunction 18 which is formed in an InGaAlP layer, preferably comprising the semiconductor alloy $In_{0.5}(Ga_{1-z}Al_z)_{0.5}P$ where z denotes the aluminum composition, and most preferably comprises $In_{0.5}Ga_{0.45}Al_{0.05}P$ with a bandgap energy of 2.0 eV. The InGaAlP layer can be about 3.1 $\mu$m thick, with the first 3 $\mu$m thickness of the layer being n-type doped to about $1\times10^{17}$ cm$^{-3}$ with silicon (from $Si_2H_6$), and with the remaining 0.1 $\mu$m thickness of the layer being p-type doped to about $3\times10^{18}$ cm$^{-3}$ with zinc from dimethylzinc (DMZn). The InGaAlP layer forming the third homojunction 18 can be grown at a temperature in the range of about 700–750° C.

The bandgap energy of the InGaAlP third homojunction 18 is higher than that for an InGaP homojunction in a conventional multi-junction solar cell. This increased bandgap energy of the third homojunction 18, in combination with the provision of the InGaAsN first homojunction 14, increases an overall energy conversion efficiency for the solar cell 10 of the present invention as compared to conventional multi-junction solar cells. The reason for this is that according to the present invention all p-n homojunctions 14, 16, 18 and 20 (if present) generate substantially equal short-circuit electrical currents in response to incident light, thereby preventing any current starvation (also termed bottlenecking) which is present with conventional multi-junction solar cells.

This current starvation or bottlenecking problem arises in conventional multi-junction solar cells since the short-circuit electrical currents generated in different homojunctions in response to incident light are not equal. Since the different homojunctions are electrically connected in series, the homojunction that produces the smallest short-circuit current limits an overall current that can be drawn from that solar cell. This is disadvantageous since it limits an overall energy conversion efficiency for the solar cell. As a result, conventional multi-junction solar cells have heretofore been limited in efficiency to about 30% at best.

According to the present invention, the short-circuit electrical current, $I_{SC}$, generated in each homojunction is substantially equal as shown in Table 1. This optimizes performance of the high-efficiency solar cell 10 of the present invention and results in a substantial improvement in the overall energy conversion efficiency.

A passivation layer 28 is preferably epitaxially grown by MOCVD above the InGaAlP third homojunction 18. The passivation layer 28 can comprise about 30 nm of InAlP (e.g. $In_{0.5}Al_{0.5}P$) which is doped p-type to about $8\times10^{18}$ cm$^{-3}$ with zinc from DMZn. The InAlP passivation layer 28 can be grown at a temperature of about 750° C., and has a bandgap energy of about 2.5 eV.

A GaAs cap layer 30 can then be epitaxially grown by MOCVD above the passivation layer 28 for use in electrically contacting the solar cell 10. The GaAs cap layer 30 is about 30 nm thick and can be doped p-type to about $3\times10^{19}$ cm$^{-3}$. The p-type dopant can be carbon (from $CCl_4$ or $CBr_4$). The GaAs cap layer 30 is typically grown at about 640° C. This completes epitaxial growth of the solar cell structure.

The substrate 12 containing the plurality of semiconductor layers can then be patterned and etched to provide one or more windows or openings 32 through the GaAs cap layer 30 down to the passivation layer 28 as shown in FIG. 1. These openings 32 eliminate absorption of incident light in the GaAs cap layer 30 that would otherwise occur.

An upper electrode 34 (e.g. comprising an Au/Be metallization) can then be deposited above the cap layer 30 and patterned. The upper electrode 34 generally has a comb structure as shown schematically in FIG. 1, and conforms to the unetched portion of the cap layer 30. Other electrode arrangements are possible, depending upon a particular size or application of the solar cell 10 to be formed (e.g. whether a solar concentrator is to be used with the solar cell 10). A full-surface lower electrode 36 (e.g. Au/Ge/Ni) can be deposited on a lower surface (i.e. under side) of the substrate 12.

To complete the high-efficiency solar cell 10, an AR coating (not shown in FIG. 1) is applied over the exposed passivation layer 28 in the openings 32. The AR coating (e.g. comprising alternating $SiO_2$ and TiO2 layers) substantially reduces a surface reflection of the incident light that would otherwise occur. With solar illumination, the completed 4-junction solar cell 10 of FIG. 1 can generate electricity with an estimated AM0 energy conversion efficiency of about 40% or more.

Table 1 lists the calculated characteristics of the 4-junction high-efficiency solar cell 10 described heretofore and shown in FIG. 1. In Table 1, projected values are provided for each homojunction in terms of bandgap energy, open-circuit voltage, $V_{OC}$, short-circuit electrical current, $I_{SC}$, fill factor and homojunction optical-to-electrical energy conversion efficiency. The bandgap energy combination of the p-n homojunctions as listed in Table 1 provides an excellent matching of the short-circuit electrical current across each series-connected homojunction and also minimizes super-bandgap photon thermalization losses. Theoretical calculations for the 4-junction high-efficiency solar cell 10 in Table 1 show an overall AM0 energy conversion efficiency of 42.3%.

TABLE 1

| Homo-junction Composition | Bandgap Energy (eV) | Open-Circuit Voltage (V) | Short-Circuit Current (mA/cm²) | Fill Factor | Theoretical Energy Conversion Efficiency (%) |
| --- | --- | --- | --- | --- | --- |
| InGaAlP | 2.00 | 1.59 | 18.6 | 0.918 | 0.201 |
| GaAs | 1.42 | 1.02 | 18.6 | 0.884 | 0.124 |
| InGaAsN | 1.05 | 0.64 | 18.6 | 0.835 | 0.074 |
| Ge | 0.67 | 0.25 | 18.6 | 0.689 | 0.024 |

In other embodiments of the present invention a 3-junction solar cell 10 can be formed by omitting the diffused homojunction in the substrate 12 and the first tunnel junction 22. In these embodiments, which can be formed on either a Ge substrate 12 or a GaAs substrate 12, the theoretical energy conversion efficiency can be about 40% since from Table 1, the energy conversion efficiency of the Ge diffused homojunction 20 is only 2.4%. Such a 3-junction solar cell 10 may be advantageous under certain conditions, especially when the solar cell 10 is operated at an elevated temperature (e.g. 100° C.) where the open-circuit voltage of a Ge diffused homojunction 20 is reduced below the value listed in Table 1, thereby providing an even smaller contribution to the overall energy conversion efficiency of the solar cell 10. For such applications, a 3-junction solar cell 10 without the Ge diffused homojunction will perform nearly as well as a 4-junction solar cell 10, while being easier to manufacture.

The matter set forth in the foregoing description and accompanying drawings is offered by way of illustration only and not as a limitation. Other applications and variations of the high-efficiency solar cell and method for fabrication thereof will become evident to those skilled in the art. In some embodiments of the present invention, one or more of the homojunctions 14, 16 and 18 can be replaced with heterojunctions. As an example, the GaAs second homojunction 16 can be replaced with a GaAs/AlGaAs heterojunction. Additionally, if the high-efficiency solar cell is formed on an n-type substrate 12, the polarities of each homojunction, tunnel junction and BSF layer can be reversed. The actual scope of the invention is intended to be defined in the following claims when viewed in their proper perspective based on the prior art.

What is claimed is:

1. A high-efficiency solar cell comprising:
   a plurality of stacked semiconductor p-n junctions, each p-n junction formed in an epitaxially-grown semiconductor layer of a different composition, and each pair of p-n junctions being separated by an epitaxially-grown semiconductor tunnel junction, one of the p-n junctions being formed in a semiconductor layer comprising a semiconductor alloy of indium gallium arsenide nitride (InGaAsN).

2. The high-efficiency solar cell of claim 1 wherein the plurality of stacked semiconductor p-n junctions are formed on a semiconductor substrate.

3. The high-efficiency solar cell of claim 2 wherein a lattice constant of each semiconductor layer is substantially equal to the lattice constant of the substrate.

4. The high-efficiency solar cell of claim 2 wherein the semiconductor substrate comprises germanium (Ge).

5. The high-efficiency solar cell of claim 4 wherein the germanium substrate is p-type or n-type doped.

6. The high-efficiency solar cell of claim 1 wherein the indium gallium arsenide nitride semiconductor layer comprises $In_xGa_{1-x}As_{1-y}N_y$.

7. The high-efficiency solar cell of claim 6 wherein compositional values for x and y are related by the compositional value of x being substantially equal to three times the compositional value of y.

8. The high-efficiency solar cell of claim 6 wherein a bandgap energy of the $In_xGa_{1-x}As_{1-y}N_y$ semiconductor layer is in a range from about 1.0 eV to 1.2 eV.

9. The high-efficiency solar cell of claim 1 wherein each semiconductor layer has a layer thickness in the range of 1–5 microns.

10. The high-efficiency solar cell of claim 9 wherein each semiconductor tunnel junction has a layer thickness of about 20–30 nanometers.

11. The high-efficiency solar cell of claim 1 wherein the semiconductor p-n junctions are formed in order of epitaxial growth:
   a first p-n junction comprising a layer of indium gallium arsenide nitride (InGaAsN);
   a second p-n junction comprising a layer of gallium arsenide (GaAs); and
   a third p-n junction comprising a layer of indium gallium aluminum phosphide (InGaAlP).

12. The high-efficiency solar cell of claim 11 wherein the p-n junctions are epitaxially grown upon a germanium (Ge) substrate.

13. The high-efficiency solar cell of claim 12 wherein the Ge substrate further includes a diffused p-n junction formed below an upper surface of the substrate.

14. The high-efficiency solar cell of claim 13 wherein the semiconductor tunnel junction separating the Ge substrate and the first p-n junction comprises a semiconductor alloy selected from the group consisting of gallium arsenide (GaAs), indium gallium arsenide nitride (InGaAsN), and indium gallium aluminum arsenide nitride (In(GaAl)AsN).

15. The high-efficiency solar cell of claim 11 wherein the semiconductor alloy composition of the first p-n junction and the third p-n junction are selected to provide a substantially equal short-circuit electrical current generated in response to incident light.

16. The high-efficiency solar cell of claim 15 wherein the short-circuit electrical current generated by each of the p-n junctions in response to the incident light is substantially equal.

17. The high-efficiency solar cell of claim 11 wherein the semiconductor tunnel junction separating the first p-n junction and the second p-n junction comprises gallium arsenide (GaAs).

18. The high-efficiency solar cell of claim 11 wherein the semiconductor tunnel junction separating the second p-n junction and the third p-n junction comprises stacked layers of aluminum gallium arsenide (AlGaAs) and indium gallium phosphide (InGaP).

19. The high-efficiency solar cell of claim 11 further including an electrically-conducting passivation layer epitaxially grown above the third p-n junction.

20. The high-efficiency solar cell of claim 19 wherein the passivation layer comprises indium aluminum phosphide (InAlP).

21. The high-efficiency solar cell of claim 19 further including a cap layer epitaxially grown above the passivation layer and patterned by etching to provide a plurality of openings therethrough to expose the passivation layer.

22. The high-efficiency solar cell of claim 21 wherein the cap layer comprises gallium arsenide (GaAs).

23. The high-efficiency solar cell of claim 21 further including electrodes above the patterned cap layer and below the semiconductor p-n junctions for conducting electricity generated by the solar cell in response to incident light.

24. A high-efficiency solar cell comprising:
  a semiconductor substrate having epitaxially grown thereon a plurality of semiconductor p-n junctions including:
  a first p-n junction comprising a layer of indium gallium arsenide nitride (InGaAsN);
  a second p-n junction comprising a layer of gallium arsenide (GaAs); and
  a third p-n junction comprising a layer of indium gallium aluminum phosphide (InGaAlP),
  each pair of adjacent p-n junctions being separated by an epitaxially-grown semiconductor tunnel junction.

25. The high-efficiency solar cell of claim 24 wherein the semiconductor substrate comprises germanium (Ge).

26. The high-efficiency solar cell of claim 25 wherein the semiconductor substrate further includes a diffused p-n junction formed below an upper surface of the substrate whereon the plurality of p-n junctions are disposed.

27. The high-efficiency solar cell of claim 24 further including a passivation layer epitaxially grown above the third p-n junction.

28. The high-efficiency solar cell of claim 27 wherein the passivation layer comprises indium aluminum phosphide (InAlP).

29. The high-efficiency solar cell of claim 27 further including a cap layer comprising gallium arsenide (GaAs) epitaxially grown above the passivation layer, and patterned to provide a plurality of openings therethrough.

30. The high-efficiency solar cell of claim 24 further including electrodes deposited above the plurality of semiconductor layers and below the substrate for conducting electricity generated in response to light incident on the solar cell.

31. The high-efficiency solar cell of claim 24 wherein each of the plurality of p-n junctions provides a substantially equal short-circuit electrical current generated in response to incident light.

32. The high-efficiency solar cell of claim 24 wherein a semiconductor alloy composition of the first p-n junction is selected to provide a bandgap energy in the range of about 1.0–1.2 eV.

33. The high-efficiency solar cell of claim 32 wherein the bandgap energy of the first p-n junction is about 1.05 eV.

34. The high-efficiency solar cell of claim 24 wherein the bandgap energy of the third p-n junction is about 2.0 eV.

35. A method for fabricating a high-efficiency solar cell, comprising steps for:
  epitaxially growing a plurality of semiconductor p-n junctions on a semiconductor substrate, one of the p-n junctions comprising a layer of indium gallium arsenide nitride (InGaAsN); and
  epitaxially growing a plurality of semiconductor tunnel junctions, with each tunnel junction being located between a pair of the p-n junctions.

36. The method of claim 35 wherein the semiconductor substrate further includes a diffused p-n junction formed below an upper surface of the substrate.

37. The method of claim 36 wherein the diffused p-n junction is formed in the substrate by a step for thermally diffusing a dopant into the substrate at an elevated temperature.

38. The method of claim 36 wherein the substrate comprises germanium (Ge).

39. The method of claim 35 wherein another of the plurality of semiconductor p-n junctions comprises a layer of indium gallium aluminum phosphide (InGaAlP).

40. The method of claim 39 wherein the indium gallium aluminum phosphide (InGaAlP) layer is epitaxially grown above the indium gallium arsenide nitride (InGaAsN) layer.

41. The method of claim 35 wherein the steps for epitaxially growing the p-n junctions and tunnel junctions are performed using a metal-organic chemical vapor deposition (MOCVD) epitaxial-growth apparatus.

42. The method of claim 41 wherein the indium gallium arsenide nitride semiconductor layer is epitaxially grown at a temperature in the range of 500–680° C.

43. The method of claim 42 further including a step for in-situ annealing of the indium gallium arsenide nitride semiconductor layer at a temperature above 700° C.

44. The method of claim 35 wherein the step for epitaxially growing the plurality of semiconductor p-n junctions comprises growing each p-n junction with a different semiconductor alloy composition, with each semiconductor alloy composition being selected to provide a semiconductor layer with a lattice constant that is substantially equal to the lattice constant of the substrate.

45. The method of claim 44 wherein the semiconductor alloy composition of the indium gallium arsenide nitride semiconductor layer comprises $In_xGa_{1-x}As_{1-y}N_y$.

46. The method of claim 45 wherein compositional values for x and y are related by the compositional value of x being substantially equal to three times the compositional value of y.

47. The method of claim 45 wherein a bandgap energy of the $In_xGa_{1-x}As_{1-y}N_y$ semiconductor layer is in a range from about 1.0 eV to 1.2 eV.

48. The method of claim 39 wherein a bandgap energy of the indium gallium aluminum phosphide (InGaAlP) layer is about 2.0 eV.

49. The method of claim 35 wherein the step for epitaxially growing the plurality of p-n junctions comprises growing each p-n junction in a semiconductor layer having a layer thickness in the range of 1–5 microns.

50. The method of claim 35 wherein the step for epitaxially growing the plurality semiconductor tunnel junctions comprises growing each semiconductor tunnel junction with a layer thickness of about 20–30 nanometers.

51. The method of claim 35 further including a step for epitaxially growing a passivation layer above the plurality of semiconductor layers.

52. The method of claim 51 wherein the passivation layer comprises indium aluminum phosphide (InAlP).

53. The method of claim 51 further including a step for epitaxially growing a cap layer above the passivation layer.

54. The method of claim 53 wherein the cap layer comprises gallium arsenide (GaAs).

55. The method of claim 53 further including a step for patterning the cap layer by etching and thereby providing a plurality of openings through the cap layer for exposing the passivation layer.

56. The method of claim 53 further including steps for depositing and patterning an upper electrode above the cap layer and depositing a lower full-surface electrode below the substrate.

57. The method of claim 35 wherein the semiconductor substrate comprises germanium (Ge), and the step for epitaxially growing the plurality of semiconductor p-n junctions comprises steps for:
  epitaxially growing above the germanium substrate the indium gallium arsenide nitride (InGaAsN) p-n junction;
  epitaxially growing above the indium gallium arsenide nitride p-n junction a gallium arsenide (GaAs) p-n junction; and
  epitaxially growing above the gallium arsenide p-n junction an indium gallium aluminum phosphide (InGaAlP) p-n junction.

58. The method of claim 57 wherein the step for epitaxially growing the InGaAsN p-n junction comprises growing the InGaAsN p-n junction from an InGaAsN semiconductor alloy composition having a bandgap energy of about 1.05 eV.

59. The method of claim 57 wherein the step for epitaxially growing the InGaAlP p-n junction comprises growing the InGaAlP p-n junction from an InGaAlP semiconductor alloy composition having a bandgap energy of about 2.0 eV.

60. The method of claim 57 wherein the step for epitaxially growing the semiconductor tunnel junction between the InGaAsN p-n junction and the GaAs p-n junction comprises growing a GaAs tunnel junction.

61. The method of claim 57 wherein the step for epitaxially growing the semiconductor tunnel junction between the GaAs p-n junction and the InGaAlP p-n junction comprises growing a tunnel junction formed of stacked layers of aluminum gallium arsenide (AlGaAs) and indium gallium phosphide (InGaP).

* * * * *